US006477097B2

United States Patent
Inoue

(10) Patent No.: US 6,477,097 B2
(45) Date of Patent: Nov. 5, 2002

(54) DATA BACKUP MEMORY

(75) Inventor: Genichiro Inoue, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/892,699

(22) Filed: Jun. 28, 2001

(65) Prior Publication Data

US 2002/0002663 A1 Jan. 3, 2002

(30) Foreign Application Priority Data

Jun. 28, 2000 (JP) .................................... 2000-193632

(51) Int. Cl.[7] .............................................. G11C 7/00
(52) U.S. Cl. ..................................... 365/203; 365/154
(58) Field of Search .............................. 365/203, 154; 327/211, 212, 333

(56) References Cited

U.S. PATENT DOCUMENTS

| 5,892,385 A | * | 4/1999 | Hashiguchi | .............. 327/333 |
| 6,023,179 A | | 2/2000 | Klass | .............. 327/211 |
| 6,043,696 A | * | 3/2000 | Klass | .............. 327/211 |

* cited by examiner

*Primary Examiner*—A. Zarabian
(74) *Attorney, Agent, or Firm*—Parkhurst & Wendel, L.L.P.

(57) ABSTRACT

To provide a data backup memory that can function, when used to design an LSI, for a circuit operating at a frequency double that of a clock provided. The data backup memory includes a first precharge node, a second precharge node, a first precharge circuit, a second precharge circuit, a first discharge circuit, and a second discharge circuit. It can maintain and improve the characteristics of conventional data backup memories that the setup time therefor is ideally zero and that the worst value of a delay time can be designed to be small, while enabling data processing both at a rising and a falling edges of a clock signal.

4 Claims, 7 Drawing Sheets

DATA BACKUP MEMORY

FIELD OF THE INVENTION

The present invention relates to a data backup memory that temporarily stores input data synchronously with a lock signal like a flip flop that is implemented by means of a semiconductor integrated circuit.

BACKGROUND OF THE INVENTION

In recent years, technologies for semiconductor integrated circuits such as LSIs have been significantly improved, with their operating frequencies remarkably increased. However, further improvement of the performance of semiconductor integrated circuits is continuously demanded; power consumption is required to be lower, and operations are required to be faster. That is, for design of semiconductor integrated circuits, both faster operations and lower power consumption are required.

One of the basic elements constituting such a semiconductor integrated circuit is a data backup memory operating synchronously with a clock signal; such a data backup memory is represented by a flip flop. That data backup memory is a very basic circuit for a semiconductor integrated circuit, so that various circuits have been proposed to increase the operation speed and reduce the power consumption. An example of known data backup memories is U.S. Pat. No. 5,917,355 entitled "Edge-triggered staticized dynamic flip-flop with conditional shut-off mechanism".

The conventional data backup memory as described above will be described below with reference to drawings.

FIG. 7 is a circuit diagram showing the configuration of a conventional data backup memory. In this figure, reference numeral 1001 denotes a P channel transistor that remains on to precharge a first precharge node 1041 while a clock signal terminal (CK) 1031 is set to zero. Reference numerals 1021 and 1022 denote inverters that delay a signal from the clock signal terminal (CK) 1031 for a fixed period of time to generate a delayed clock signal (CKD) 1042. Reference numeral 1027 denotes a two-input logical-AND denying circuit using the first precharge node 1041 and the delayed clock signal (CKD) 1042 as an input and using a stop signal (S) 1043 as an output. The stop signal (S) 1043 from the circuit 1042 is set to zero only while both the first precharge node 1041 and the delayed clock signal (CKD) 1042 are set to one.

Reference numerals 1011 to 1013 denote N channel transistors connected together in series and which discharge the first precharge node 1041 when all of them are on. Specifically, if the first precharge node 1041 is set to zero or the delayed clock signal (CKD) 1042 is set to zero, and when the N channel transistor 101 is on and an input data terminal (D) 1033 is set to one, the N channel transistor 1012 is turned on. In this case, when the clock signal terminal (CK) 1031 is set to one, the N channel transistor 1013 is turned on.

Reference numerals 1023 and 1024 denote inverters that can retain the value for the first precharge node 1041 softly. When the P channel transistor 1001 is turned on, the first precharge node 1041 is precharged. When all the N channel transistors 1011 to 1013 are turned on, the first precharge node 1041 is discharged. The term "retain softly" means that the value for the first precharge node 1041 is retained when the P channel transistor 1001 is off and when at least one of the N channel transistors 1011 to 1013 is off.

Reference numeral 1002 denotes a P channel transistor that remains on to precharge the second precharge node 1051 while the first precharge node 1041 is set to zero. Reference numerals 1014 and 1015 denote N channel transistors connected together in series and which discharge a second precharge node 1051 when both of them are on. Specifically, if the clock signal terminal (CK) 1031 is set to one, the N channel transistor 1015 is turned on. If the first precharge node 1041 is set to one, the N channel transistor 1014 is turned on.

Reference numerals 1025 and 1026 denote inverters that can retain the value for the second precharge node 1051 softly.

The conventional data backup memory configured as described above constitutes a flip flop that writes a value to the input data terminal (D) 1033 at a rising edge of the clock signal terminal (CK) 1031. Specific operations of the data backup memory will be described below.

First, the operation performed while the clock signal from the clock signal terminal (CK) 1031 is zero will be described.

At this time, the P channel transistor 1001 is on, the N channel transistor 1013 is off, and the first precharge node 1041 is set to one because a precharge path is open, while a discharge path is closed.

At this time, since the first precharge node 1041 is set to one, while the clock signal terminal (CK) 1031 is set to zero, both the precharge path and the discharge path are closed, so that the inverters 1023 and 1024 retain the previous value of the second precharge node 1051 softly.

Next, the operation performed after the clock signal has risen from zero to one and before the delayed clock (CKD) 1042 rises from zero to one will be described.

At this time, the P channel transistor 1001 is off, and the N channel transistor 1013 is on. In the first precharge node 1041, the precharge path is closed, and the discharge path is open when the input data terminal (D) 1033 is set to one, and is closed when the input data terminal (D) 1033 is set to zero.

That is, when the input data terminal (D) 1033 is set to one, the first precharge node 1041 is discharged. When the input data terminal (D) 1033 is set to zero, both the precharge path and the discharge path are closed, so that the inverters 1023 and 1024 retain value for the first precharge node 1041 softly.

In other words, if the input data is one, a value zero is written to the first precharge node 1041. If the input data is zero, a value one is written to the first precharge node 1041.

Further, when the value zero is written to the first precharge node 1041, the P channel transistor 1002 is turned on, while the N channel transistor 1014 is turned off, so that the value one is written to the second precharge node 1051. When the value one is written to the first precharge node 1041, the P channel transistor 1002 is turned off, while the N channel transistor 1015 is turned on. Since the N channel transistor 1014 is on, the value zero is written to the second precharge node 1051.

Finally, a description will be given of the operation performed when the clock signal is one and when the delayed clock signal (CKD) 1042 is one.

At this time, if the first precharge node 1041 is set to one, the stop signal (S) 1043 is zero. Accordingly, in the first precharge node 1041, since both the precharge path and the discharge path are closed, the inverters 1023 and 1024 retain the value one softly. If the first precharge node 1041 is set to zero, the precharge path is closed whether the discharge path is open or closed, so that the first precharge node 1041 is set to zero.

Further, when the first precharge node 1041 is set to, zero, the P channel transistor 1002 is turned on, while the N channel transistor 1014 is turned off, so that the second precharge node 1051 is set to one. When the first precharge node 1041 is set to one, the P channel transistor 1002 is turned off, the N channel transistor 1015 is turned on and the N channel transistor 1014 is turned on, so that the second precharge node 1051 is set to zero.

As described above, in the conventional data backup memory configured as described above, the value for the input data terminal (D) 1033 is written to the memory synchronously with the rising edge of the clock signal from the clock signal; terminal (CK) 1031, whereas the data retaining operation is performed during the other periods.

In this case, the value of the second precharge node 1051 is output from the output data terminal (Q) 1034 as an output data signal.

Due to the constitutional characteristic (the N channel transistor 1012 to which the input data terminal (D) 1033 is connected and the N channel transistor 1013 to which the clock signal terminal (CK) 1031 is connected are connected in series) of this conventional data backup memory, the setup time for this memory is ideally zero. Further, the worst value of the delay time required before the output signal from the input data terminal (D) 1033 is written to the second precharge node 1051 is the sum of the time required by the three N channel transistors 1011 to 1013 connected together in series to discharge the first precharge node 1041 and the delay time required by the P channel transistor 1002 to precharge the second precharge node 1051.

When, however, the conventional data backup memory as described above is used as a flip flop to design an LSI circuit, and when an attempt is made to increase the operating frequency of the circuit, a clock signal (timing control signal) having a frequency as high as the operating speed of the circuit must be supplied. Thus, problems of such a data backup memory are that a clock signal generating circuit provided must generate a high frequency and that a clock of a high frequency must be accurately distributed within the LSI.

Another problem is that the clock signal of a high frequency as described above may increase the power consumed by the clock generating circuit and a clock distributing circuit.

DISCLOSURE OF THE INVENTION

The present invention solves these conventional problems, and an object of the present invention is to provide a data backup memory that serves, if it is used to design an LSI, to reduce the frequency of a timing control signal supplied to the LSI to half of the conventional value and to substantially reduce the power consumption of the LSI associated with the timing control signal and the loads on a timing control circuit.

To attain this object, the present invention provides a data backup memory using as input a timing control signal having a period indicating a first phase and a period indicating a second phase as well as a data signal that can assume a first state and a second state, to process the data signal synchronously with the timing control signal and temporarily store the state of the data signal, the data backup memory characterized by comprising a first precharge node, second precharge node, a first precharge circuit, a second precharge circuit, a first discharge circuit, and a second discharge circuit, the first precharge circuit increasing a potential at the first precharge node up to and above a first boundary value during the first phase of the timing control signal, the first discharge circuit reducing the potential at the first precharge node below the first boundary value while the input data signal is in the second state during the second phase period of the timing control signal, the second precharge circuit increasing a potential at the second precharge node up to or above a second boundary value while the potential at the first precharge node is below the first boundary value, the second discharge circuit reducing the potential at the second precharge node below the second boundary value while the potential at the first precharge node is equal to or above the first boundary value during the second phase period of the timing control signal, the potential at the second precharge node being used as an output data signal.

Further, the present invention provides a data backup memory using as input a timing signal having a period indicating a first phase and a period indicating a second phase as well as a data signal that can assume a first state and a second state, to process the data signal synchronously with the timing control signal and temporarily store the state of the data signal, the data backup memory characterized by comprising a pulse signal generating circuit, a first precharge node, a second precharge node, a first precharge circuit, a second precharge circuit, a first discharge circuit, and a second discharge circuit, the pulse signal generating circuit outputting a pulse signal having a first pulse potential period corresponding to a fixed period from a point of time of a change in the timing control signal from a first phase period to a second phase period and from a point of time of a change therein from the second phase period to the first phase period as well as a second pulse potential period that is different from the first pulse potential period, the first precharge circuit increasing a potential at the first precharge node up to and above a first boundary value during the second pulse potential period of the pulse signal, the first discharge circuit reducing the potential at the first precharge node below the first boundary value while the input data signal is in the second state during the first pulse potential period of the pulse signal, the second precharge circuit increasing a potential at the second precharge node up to or above a second boundary value while the potential at the first precharge node is below the first boundary value, the second discharge circuit reducing the potential at the second precharge node below the second boundary value while the potential at the first precharge node is equal to or above the first boundary value during the first pulse potential period of the pulse signal, the potential at the second precharge node being used as an output data signal.

The above configuration ideally zeroes the setup time, and reduces the worst value of the delay time before the input data is written to the second precharge node as an output signal.

Thus, if the present data backup memory is used to design an LSI, the circuit can be designed while reducing the above delay time compared to the prior art, and the circuit configuration can be miniaturized compared to the prior art to reduce the scale of the LSI circuit.

Further, the input data can be written to the memory at the point of time of a change from the first phase period to the second phase period and at the point of time of a change from the second phase period to the first phase period. Accordingly, when this data backup memory is used in an LSI, operating timings based on a frequency double that of the timing control signal supplied to the LSI can be supplied to circuits in the LSI.

Thus, if the present data backup memory is used to design an LSI, the frequency of the timing control signal supplied to the LSI can be reduced to half of the conventional value, the power consumption of the LSI associated with the timing control signal can be substantially reduced, and the loads on a timing control signal generating circuit can be substantially reduced.

EMBODIMENTS

A data backup memory according to the present invention will be specifically described below with reference to the drawings showing embodiments thereof.

First Embodiment

A data backup memory according to the first embodiment of the present invention will be described.

Figure 1:
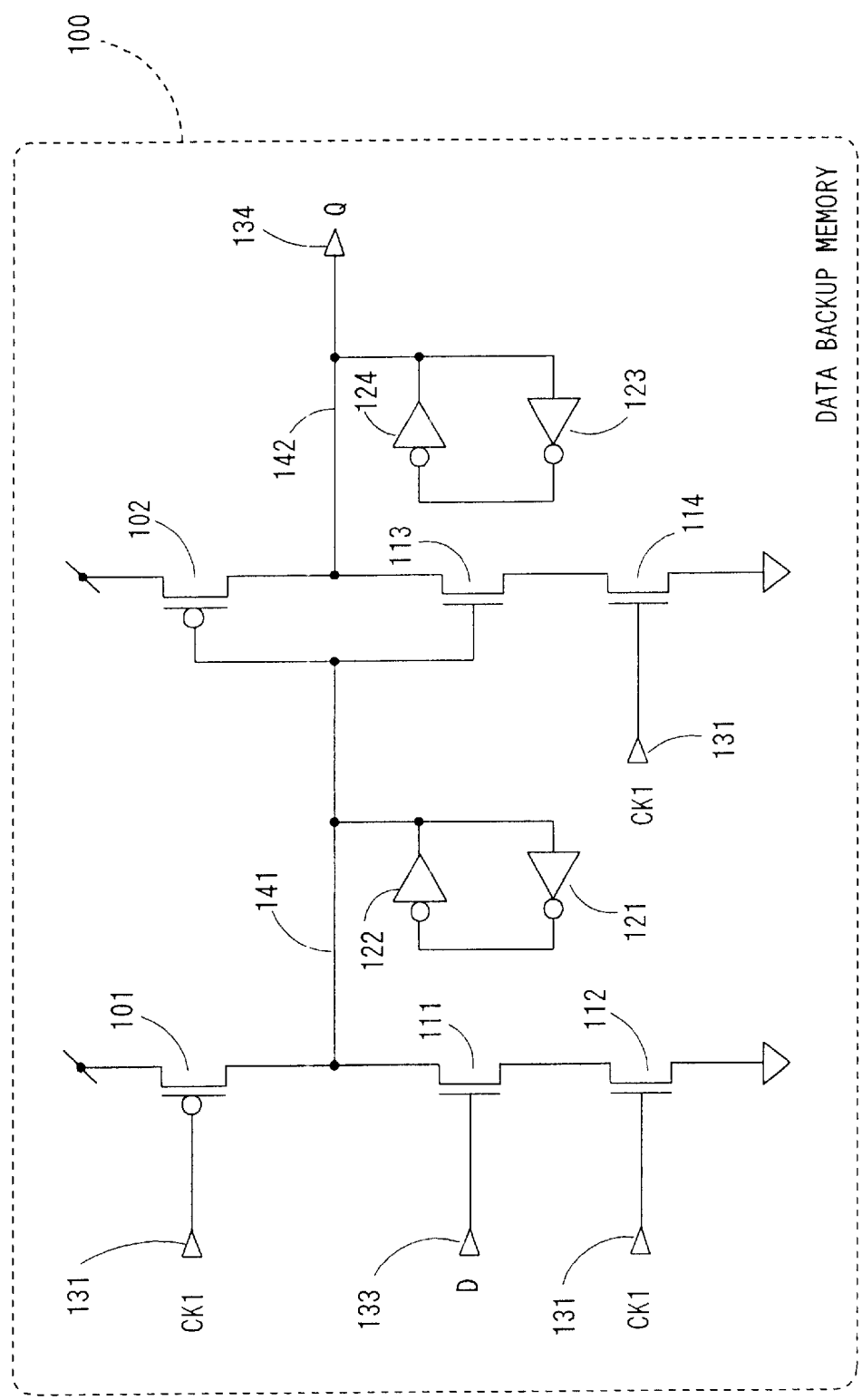
FIG. 1 is a circuit diagram showing the configuration of a data backup memory according to a first embodiment of the present invention.
Figure 2:
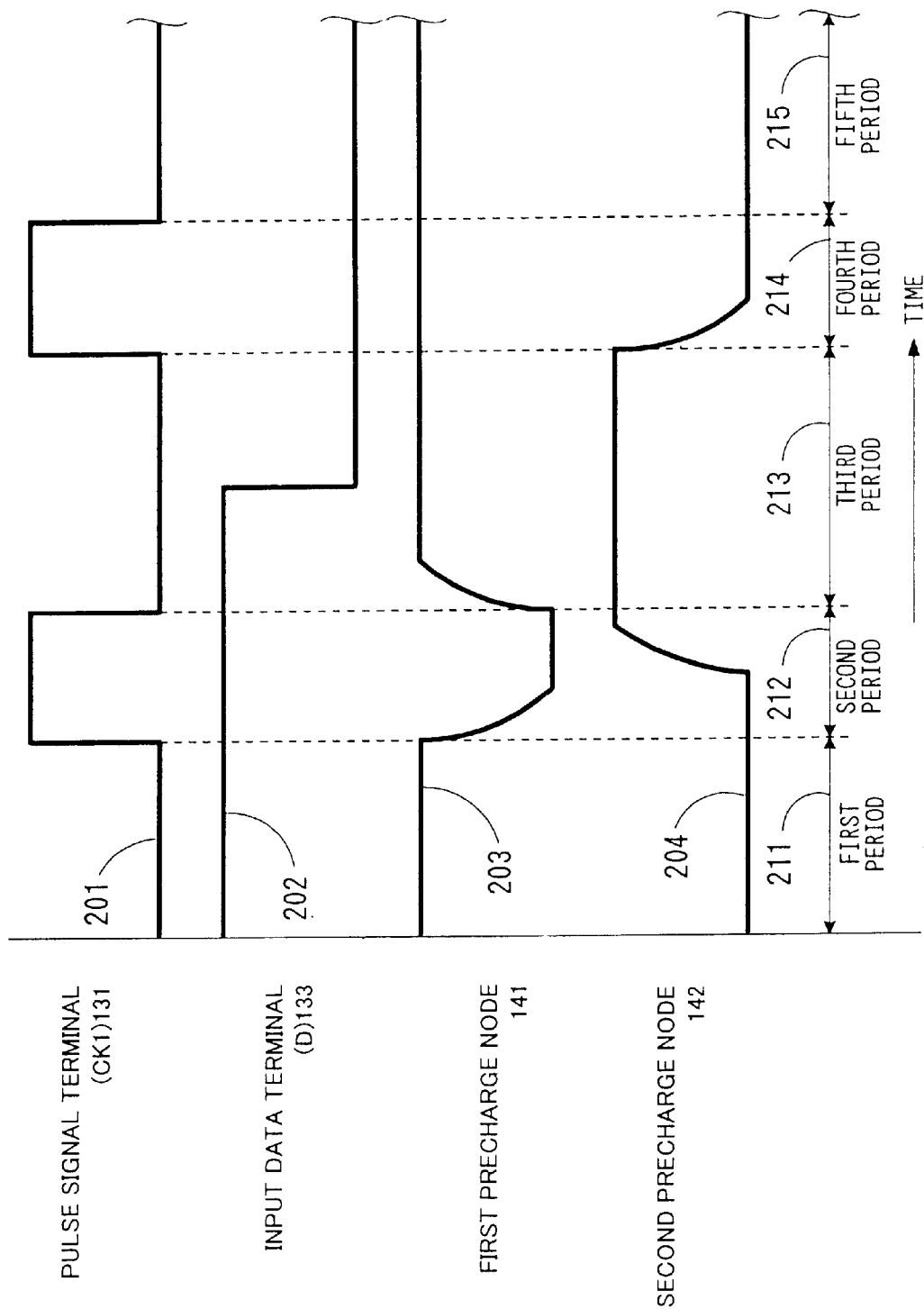
FIG. 2 is a timing chart showing an operation preformed in the first embodiment.

FIG. 1 is a circuit diagram showing the configuration of the data backup memory according to the first embodiment. FIG. 2 is a timing chart showing an operation preformed in the first embodiment. In FIG. 1, reference numeral 101 denotes a P channel transistor (first precharge circuit) that remains on to precharge the first precharge node 141 while a pulse signal terminal (CK1) 131 is set to zero. Reference numeral 111 denotes an N channel transistor that is on while an input data terminal (D) 133 is set to one. Reference numeral 112 denotes an N channel transistor that is on while a pulse signal terminal (CK1) 131 is set to one. The N channel transistors 111 and 112 (first discharge circuit) discharge the first precharge node 141 when both are on. The first precharge node 141 is not simultaneously subjected to precharging and discharging because the P channel transistor 101 and the N channel transistor 112 are not simultaneously turned on.

Reference numerals 121 and 122 denote inverters., The sizes of the transistors are adjusted so that the inverters 121 and 122 can retain the value for the first precharge node 141 softly. When the P channel transistor 101 is on, the first precharge node 141 is precharged. When both the N channel transistors 111 and 112 are on, the first precharge node 141 is discharged. The term "retain softly" means that the value for the first precharge node 141 is retained when the P channel transistor 101 is off and when at least one-of the N channel transistor 111 and 112 is off.

Reference numeral 102 is a P channel transistor (second precharge circuit) that remains on to precharge the second precharge node 142 while the first precharge node 141 is set to zero. Reference numeral 113 denotes an N channel transistor that is on while the first precharge node 141 is set to one. Reference numeral 114 denotes an N channel transistor that is on while the pulse signal terminal (CK1) 131 is set to one. When both the N channel transistors 113 and 114 (second discharge circuit) are on, the second precharger node 142 is discharged.

The second precharge node 142 is not simultaneously subjected to both precharging and discharging because the P channel transistor 102 and the N channel transistor 113 are not simultaneously turned on.

Reference numerals 123 and 124 denote inverters. The sizes of the transistors are adjusted so that the inverters 123 and 124 can retain the value for the second precharge node 142 softly. A data output terminal (Q) 134 outputs the value for the second precharge node 142 to an exterior.

In the data backup memory of the first embodiment configured as described above, when a pulsed signal is provided to the pulse signal terminal (CK1) 131, a data write is executed when the pulse signal terminal (CK1) 131 is set to one, and a data retaining operation is performed when the pulse signal terminal 131 is set to zero. A specific operation of the data backup memory will be described below with reference to the drawings.

In FIG. 2, reference numeral 201 denotes a timing chart of a pulse signal provided to the pulse signal terminal (CK1) 131 from the exterior. Reference numeral 202 denotes a timing chart of an input data signal provided to the input data terminal (D) 133 from the exterior. These charts show an operational example in which two pulsed signals are input as a pulse signal and in which the input data changes from one to zero between the pulses. Reference numeral 203 denotes a timing chart showing an operation of the first precharge node 141. Reference numeral 204 denotes a timing chart showing an operation of the second precharge node 142.

Reference numeral 211 denotes a first period when the pulse signal 201 to the pulse signal terminal (CK1) 131 is zero for the first time, reference numeral 212 denotes a second period when the pulse signal 201 is one for the first time, reference numeral 213 denotes a third period when the pulse signal 201, is zero for the second time, reference numeral 214 denotes a fourth period when the pulse signal 201 is one for the second time, and reference numeral 215 denotes a fifth period when the pulse signal 201 is zero for the third time.

Operations performed during the first period 211 to fifth period 215 will be sequentially described below.

First, the operation during the first period 211 will be described.

During the first period 211, the pulse signal terminal (CK1) 131 is provided with a value zero, so that the first precharge node 141 is precharged via the P channel transistor 101 and thus set to one, regardless of the value for the input data terminal (D) 133.

Since the first precharge node 141 is set to one and the pulse signal terminal (CK1) 131 is provided with the value zero, the second precharge node 142 is not precharged or discharged, and its value prior to the first period is retained by the inverters 123 and 124.

In this case, the value prior to the first period is assumed to be zero, so the value zero is retained. That is, during the first period, the operation of retaining the data prior to the first period is preformed.

Next, the operation during the second period 212 will be described.

During the second period 212, the pulse signal terminal (CK1) 131 is provided with a value one and the input data terminal (D) 133 is also provided with the value one, the first precharge node 141 is discharged from one to zero via the N channel transistors 111 and 112.

When the first precharge node 141 changes from one to zero, the second precharge node 142 is precharged from zero to one via the P channel transistor 102.

Accordingly, the value one, that is, the value input to the input data terminal (D) 133 is output from the data output terminal (Q) 134. That is, during the second period, the operation of writing the value one for the input data terminal (D) 133 to the data backup memory 100 is performed.

Next, the operation during the third period 213 will be described.

During the third period 213, the pulse signal terminal (CK1) 131 is provided with the value zero, so that the first precharge node 141 is precharged from zero to one via the P channel transistor 101, regardless of the value for the input data terminal (D) 133.

Further, since the first precharge node 141 changes from zero to one and the pulse signal terminal (CK1) 131 is provided with the value zero, the second precharge node 142 is not precharged or discharged (period B) after the precharge path has been opened via the P channel transistor 102 (period A). Consequently, the second precharge node retains the same value as that present at the end of the second period, that Q is, the value one during the period A, and the inverters 123 and 124 retain this value one during the period B. That is, during the third period, the operation of retaining the data prior to the third period, containing the value 1 is performed.

Next, the operation during the fourth period will be described.

During the fourth period, the pulse signal terminal (CK1) 131 is provided with the value one and the input data terminal (D) 133 is provided with the value zero, so that the first precharge node 141 is not precharged or discharged. Accordingly, the inverters 121 and 122 retains the value present at the end of the third period, that is, the value one.

Since the first precharge node 141 is set to one and the pulse signal terminal (CK1) 131 is provided with the value one, the second precharge node 142 is discharged from one to zero via the N channel transistors 113 and 114.

Consequently, the value zero, that is, the value input to the input data terminal (D) 133 is output from the output terminal (Q) 134. That is, during the fourth period 214, the operation of writing the value zero for the input data terminal (D) 133 to the data backup memory 100 is performed.

As is apparent from the operations during the second period 212 and the fourth period 214, while the pulse signal terminal (CK1) 131 is set to one, the operation of writing the value for the input data terminal (D) 133 to the data backup memory 100 is performed.

During a fifth period 215, since the pulse signal terminal (CK1) 131 is provided with the value zero, the first precharge node 141 is precharged via the P channel transistor 101 regardless of the value for the input data terminal (D) 133.

Further, since the first precharge node 141 is set to one and the pulse signal terminal (CK1) 131 is provided with the value zero, the second precharge node 142 is not precharged or discharged, so that the inverters 123 and 124 retain the value present at the end of the second period 212, that is, the value zero. That is, during the fifth period 215, the operation of retaining the value prior to the fifth period is performed.

As is apparent from the operations during the third period 213 and the fifth period 215, while the pulse signal terminal (,CK1) 131 is set to zero, the operation of retaining the data is performed.

In the data backup memory according to the first embodiment configured as described above, when a pulsed signal is provided to the pulse signal terminal (CK1) 131, the following operation can be performed: While the pulse signal terminal (CK1) 131 is set to one, the value for the input data terminal (D) 133 is written to the memory and output from the data output terminal (Q) 134. While the pulse signal terminal (CK1) 131 is set to zero, the previously written value is continuously output from the data output terminal (Q) 134 regardless of the value for the input data terminal (D) 133.

Due to the constitutional characteristic (the N channel transistor 111 to which the input data terminal (D) 133 is connected and the N channel transistor 112 to which the pulse signal terminal (CK1) 131 is connected are connected in series) of the data backup memory of the first embodiment, the setup time for this memory is ideally zero. Further, the worst value of the delay time required before the output signal from the input data terminal (D) 133 is written to the second precharge node 142 is the sum of the time required by the two N channel transistors 111 and 112 connected together in series to discharge the first precharge node 141 and the delay time required by the P channel transistor 102 to precharge the second precharge node 142. Consequently, this data backup memory is characterized by being able to design a small worst value of the delay time.

Furthermore, this worst value of the delay time can be designed to be smaller than that of the delay time for the data backup memory shown in the conventional example, thus reducing the scale of the circuit.

In the first embodiment, the inverters 121 and 122 are used to retain the first precharge node 141 softly, but this operation may be implemented in other forms.

In the first embodiment, the inverters 121 and 122 are used to hold the first precharge node 141 softly, but depending on the capacity of the first precharge node 141 and leakage current therefrom, the value for the first precharge node 141 may be retained while the pulse signal terminal (CK1) 131 has a value of zero, without the need to arrange a circuit for retaining the first precharge node 141 softly. In this case, the circuit for retaining the first precharge node 141 softly need not particularly be provided.

In the first embodiment, the inverters 123 and 124 are used to retain the second precharge node 142 softly, but this operation may be implemented in other forms.

In the first embodiment, the inverters 123 and 124 are used to retain the second precharge node 142 softly, but depending on the capacity of the second precharge node 142 and leakage current therefrom, the value for the second precharge node 142 may be retained while the pulse signal terminal (CK1) 131 has a value of zero, without the need to arrange a circuit, for retaining the second precharge node 142 softly. In this case, the circuit for retaining the second precharge node 142 softly need not particularly be provided.

Second Embodiment

A data backup memory of a second embodiment of the present invention will be described.

Figure 3:
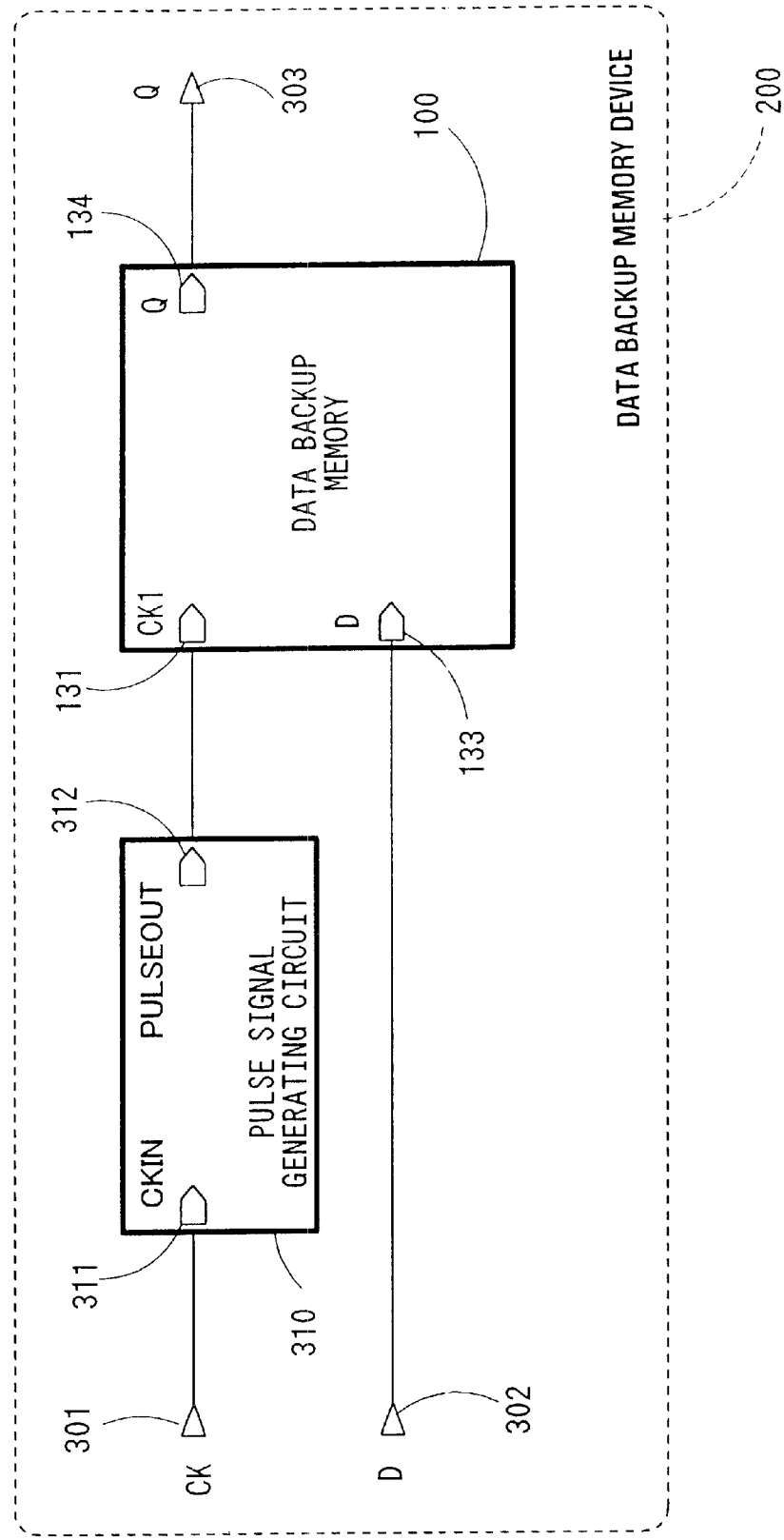
FIG. 3 is a circuit diagram showing the configuration of a data backup memory according to a second embodiment of the present invention.
Figure 4:
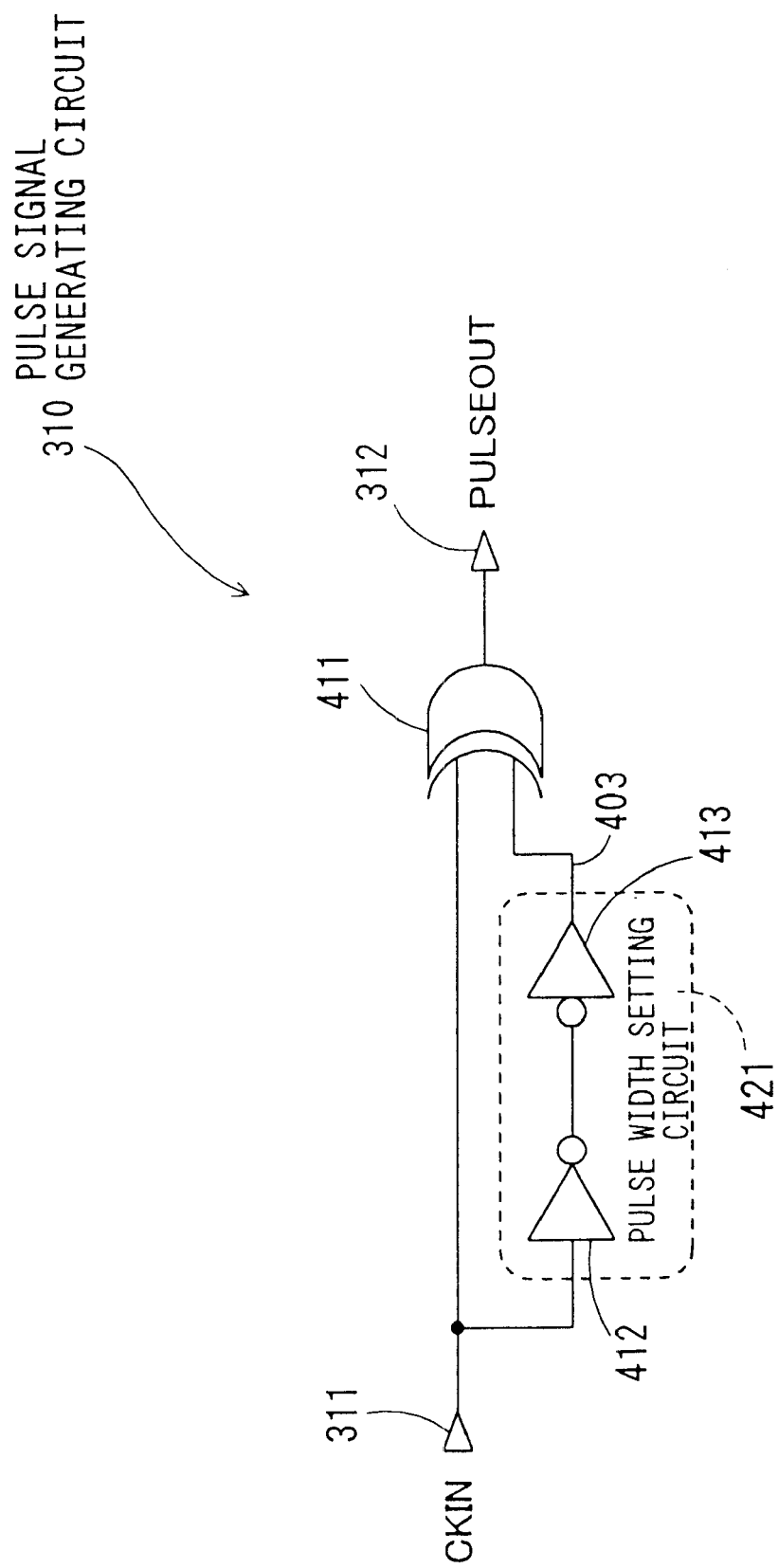
FIG. 4 is a circuit diagram showing the configuration of a pulse signal generating circuit of the second embodiment.
Figure 5:
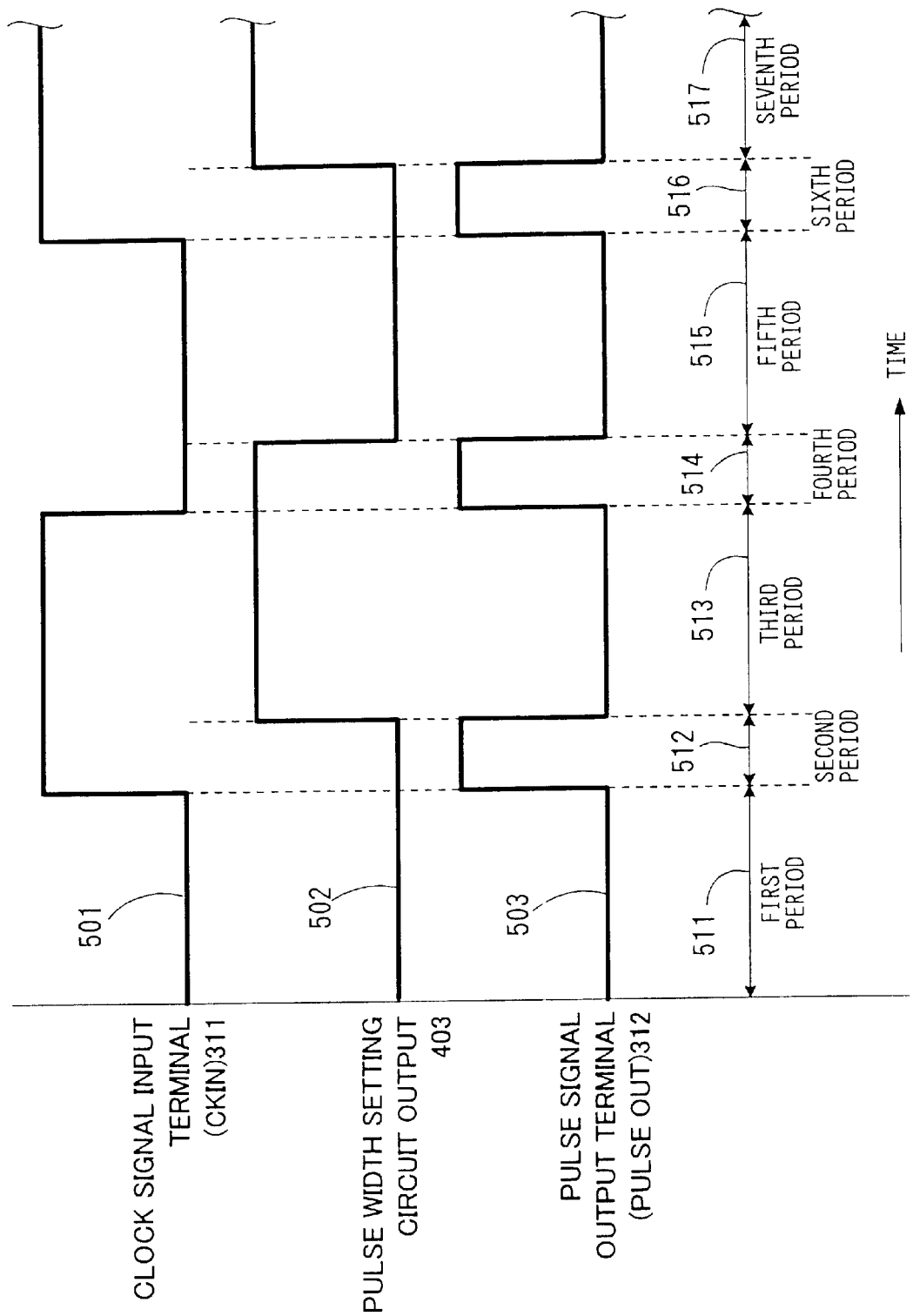
FIG. 5 is a timing chart showing an operation of the pulse signal generating circuit of the second embodiment.

FIG. 3 is a circuit diagram showing the configuration of a data backup memory according to the second embodiment. FIG. 4 is a circuit diagram showing the configuration of a pulse signal generating circuit 310 of the data backup memory in FIG. 3. FIG. 5 is a timing chart showing an operation of the pulse signal generating circuit 310 of the data backup memory in FIG. 3.

In FIG. 3, reference numeral 100 denotes a data backup memory which is the same as that described in the first embodiment. The configuration and operation of the circuit of the data backup memory 100 have already been described in the first embodiment, and detailed description thereof is omitted.

Reference numeral 310 denotes a pulse signal generating circuit comprising a clock signal input terminal (CKIN) 311 and a pulse signal output terminal (PULSEOUT) 312. When a clock signal alternating between zero and one is input to the clock signal input terminal (CKIN) 311, a pulsed signal is output from the pulse signal output terminal (PULSEOUT) 312 at a rising edge occurring when the value changes from zero to one and at a falling edge occurring when the value changes from one to zero.

The pulse signal output terminal (PULSEOUT) 312 of the pulse signal generating circuit 310 and the pulse signal terminal (CK1) 131 of the data backup memory 100 are connected together, and the clock signal input terminal (CKIN) 311 of the pulse signal generating circuit 310 is connected to the clock signal input terminal (CK) 301. The input data terminal (D) 133 of the data backup memory 100 is connected to the input data terminal (D) 302, and the data output terminal (Q) 134 of the data backup memory 100 is connected to a data output terminal (Q) 303.

FIG. 4 is a circuit diagram of the pulse signal generating circuit 310. In the figure, reference numeral 411 denotes a two-input exclusive-OR circuit having one input terminal connected to the clock signal input terminal (CKIN) 311, the other input terminal connected to an output 403 of a pulse width setting circuit 421, and an output terminal connected to the pulse signal output terminal (PULSEOUT) 312.

Reference numerals 412 and 413 denote inverters connected in series between an input and an output of the pulse width setting circuit 421 and used to generate delay therebetween.

In the data backup memory of the second embodiment configured as described above, the value for the input data terminal (D) 302 is written to the memory both at the rising and falling edges of the clock signal input to the clock signal input terminal (CK) 301, and the data retaining operation is performed during the other periods. Specific operations of this memory will be described below with reference to the drawings.

First, an operation of the pulse signal generating circuit 310 will be described.

In FIG. 5, reference numeral 501 denotes a timing chart of a clock signal externally provided to the clock signal input terminal (CKIN) 311, reference numeral 502 denotes a timing chart showing an operation of the output 403 of the pulse width setting circuit 421, and reference numeral 503 denotes a timing chart showing an operation of the pulse signal output terminal (PULSEOUT) 312.

Reference numeral 511 denotes a first period when the clock signal input terminal (CKIN) 311 is set to zero for the first time, and reference numeral 512 denotes a second period when the output 403 of the pulse width setting circuit rises from zero to one after the clock signal input terminal (CKIN) 311 has risen from zero to one for the first time. The amount of time of the second period 512 corresponds to delay time required after a pulse signal has been input to the pulse width setting circuit 421 and before an output is provided therefrom.

Reference numeral 513 denotes a third period after the second period 512 has expired and before the clock signal input terminal (CKIN) 311 falls from one to zero for the first time, and reference numeral 514 denotes a fourth period after the third period 513 has expired and before the output 403 from the pulse width setting circuit 421 falls from one to zero. The amount of time of the fourth period 514 corresponds to delay time required after a pulse signal has been input to the pulse width setting circuit 421 and before an output is provided therefrom.

Reference numeral 515 denotes a fifth period after the fourth period 514 has expired and before the clock signal input terminal (CKIN) 311 rises from zero to one for the second time, and reference numeral 516 denotes a sixth period after the clock signal input terminal (CKIN) 311 has risen from zero to one and before the output 403 from the pulse width setting circuit 421 rises from zero to one. The amount of time of the sixth period 516 corresponds to delay time required after a pulse signal has been input to the pulse width setting circuit 421 and before an output is provided therefrom. Reference numeral 517 denotes a seventh period that starts when the sixth period 516 expires.

The operations performed from the first period 511 to seventh period 517 will be sequentially described.

First, the operation during the first period 511 will be described.

During the first period 511, the clock signal input terminal (CKIN) 311 is always set to zero, so that the output 403 from the pulse width setting circuit 421 is always set to zero.

Thus, both outputs of the two-input exclusive-OR circuit 411 are set to zero, so that the output of the two-input exclusive-OR circuit 411, that is, pulse signal output terminal (PULSEOUT) 312 outputs the value zero.

Then, during the second period 512, the clock signal input terminal (CKIN) 311 changes to one, but the output 403 of the pulse width setting circuit 421 changes from zero to one an amount of time later, the amount of time corresponding to the delay time (=second period) caused by the inverters 412 and 413. Accordingly, during the second period 512, the output 413 of the pulse width setting circuit 421 remains zero.

Correspondingly, the output of the two-input exclusive-OR circuit 411, that is, the pulse signal output terminal (PULSEOUT) 312 outputs the value one.

Then, during the third period 513, the clock signal input terminal (CKIN) 311 is set to one, and the output 403 of the pulse width setting circuit 421 changes to one, so that the output of the two-input exclusive-OR circuit 411, that is, the pulse signal output terminal (PULSEOUT) 312 outputs the value zero.

Then, during the fourth period 514, the clock signal input terminal (CKIN) 311 changes to zero, but the output 403 of the pulse width setting circuit 421 changes from zero to one an amount of time later, the amount of time corresponding to the delay time (=fourth period) caused by the inverters 412 and 413. Accordingly, during the fourth period 514, the output 403 of the pulse width setting circuit 421 remains one.

Correspondingly, the output of the two-input exclusive-OR circuit 411, that is, the pulse signal output terminal (PULSEOUT) 312 outputs the value one.

The operation during the fifth period 515 is similar to that during the first period 511, the operation during the sixth period 516 is similar to that during the second period 512, and the operation during the seventh period 517 is similar to that during the third period 513.

In this manner, the pulse signal generating circuit 310 outputs a pulsed signal from the pulse signal output terminal (PULSEOUT) 312 both at the rising and falling edges of the signal from the clock signal input terminal (CKIN) 311.

An operation of the data backup memory device 200 will be described in accordance with the above operation of the pulse signal generating circuit 310.

In the data backup memory device 200 of the second embodiment, when a clock signal is input to the clock signal input terminal (CK) 301, it is input to the clock signal input terminal (CKIN) 311 of the above described pulse signal generating circuit 310, and a pulsed signal is output from the pulse signal output terminal (PULSEOUT) 312 and then input to the pulse signal terminal (CK1) 131 of the data backup memory 100, the operation of which has been described in the first embodiment. Thus, the value for the input data terminal (D) 302 is written to the memory both at the rising and falling edges of the clock signal input to the clock signal input terminal (CK) 301, whereas the data retaining operation is performed during the other periods.

The data written and retained in this manner is output from the data output terminal (Q) 303 through the data output terminal (Q) 134.

As described above, due to the constitutional characteristic (the N channel transistor 111 of the data backup memory 100 to which the input data terminal (D) 302 is connected and the N channel transistor 112 of the data backup memory 100 to which the pulse signal terminal (CK1) 131 is connected are connected in series) of the data backup memory of the second embodiment, the setup time for this memory is ideally zero. Further, the worst value of the delay time required before the output signal from the input data terminal (D) 302 is written to the second precharge node 142 is the sum of the time required by the two N channel transistors 111 and 112 connected together in series to discharge the first precharge node 141 and the delay time required by the P channel transistor 102 to precharge the second precharge node 142. Consequently, the worst value of the delay time can be designed to be smaller.

Further, this worst value of the delay time can be designed to be smaller than that of the delay time for the backup memory shown in the conventional example.

Furthermore, the data can be written to the memory both at the rising and falling edges of the clock signal input to the clock signal input terminal (CK) 301, so that when the data backup memory of the second embodiment is used to design an LSI, it can operate at a frequency double that of the clock provided.

In the second embodiment, the pulse width setting circuit 421 is composed of the inverters 412 and 413, but it may have a different configuration.

Third Embodiment

A third embodiment of the present invention will be described.

Figure 6:
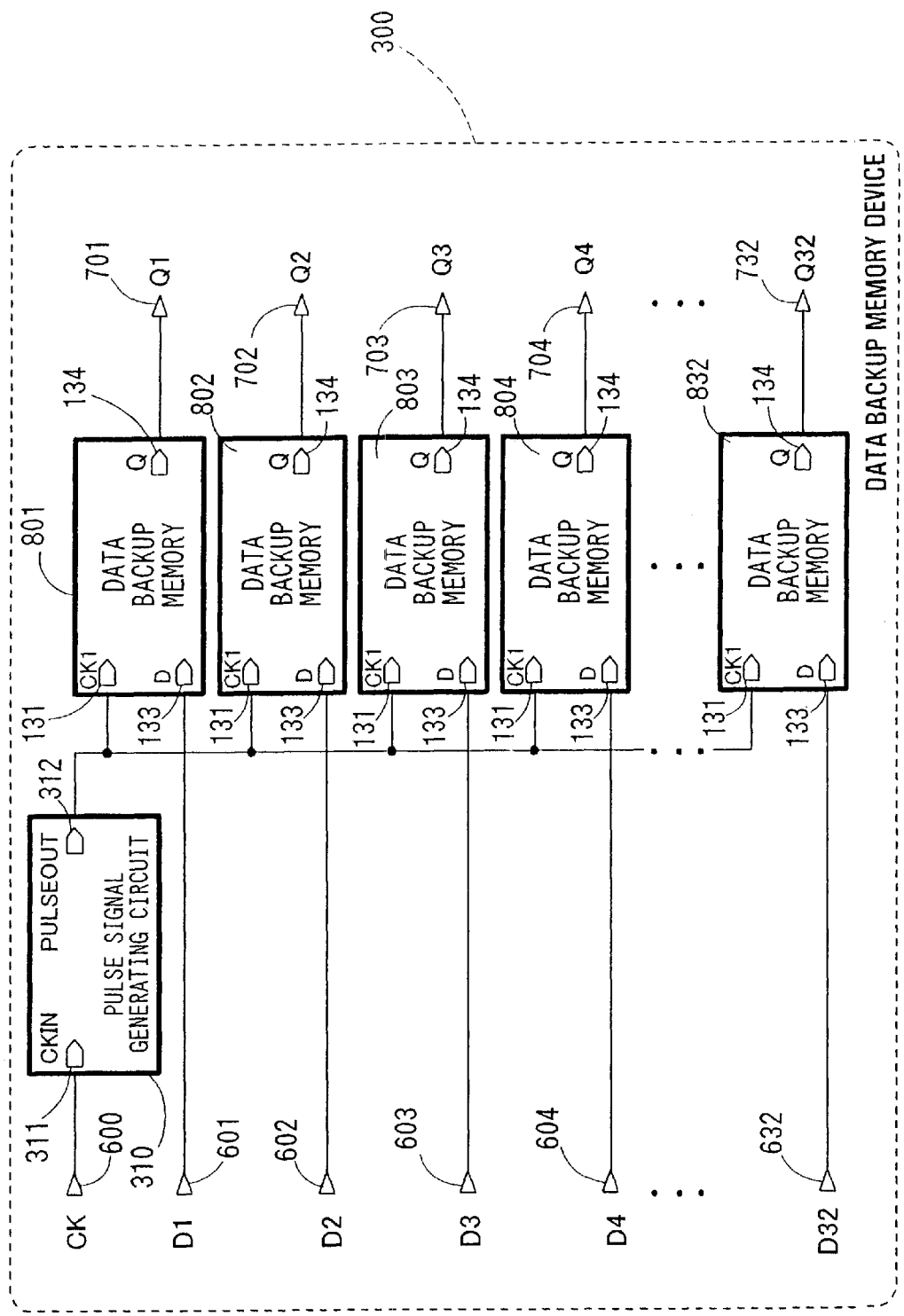
FIG. 6 is a circuit diagram showing the configuration of a data backup memory according to a third embodiment of the present invention.
Figure 7:
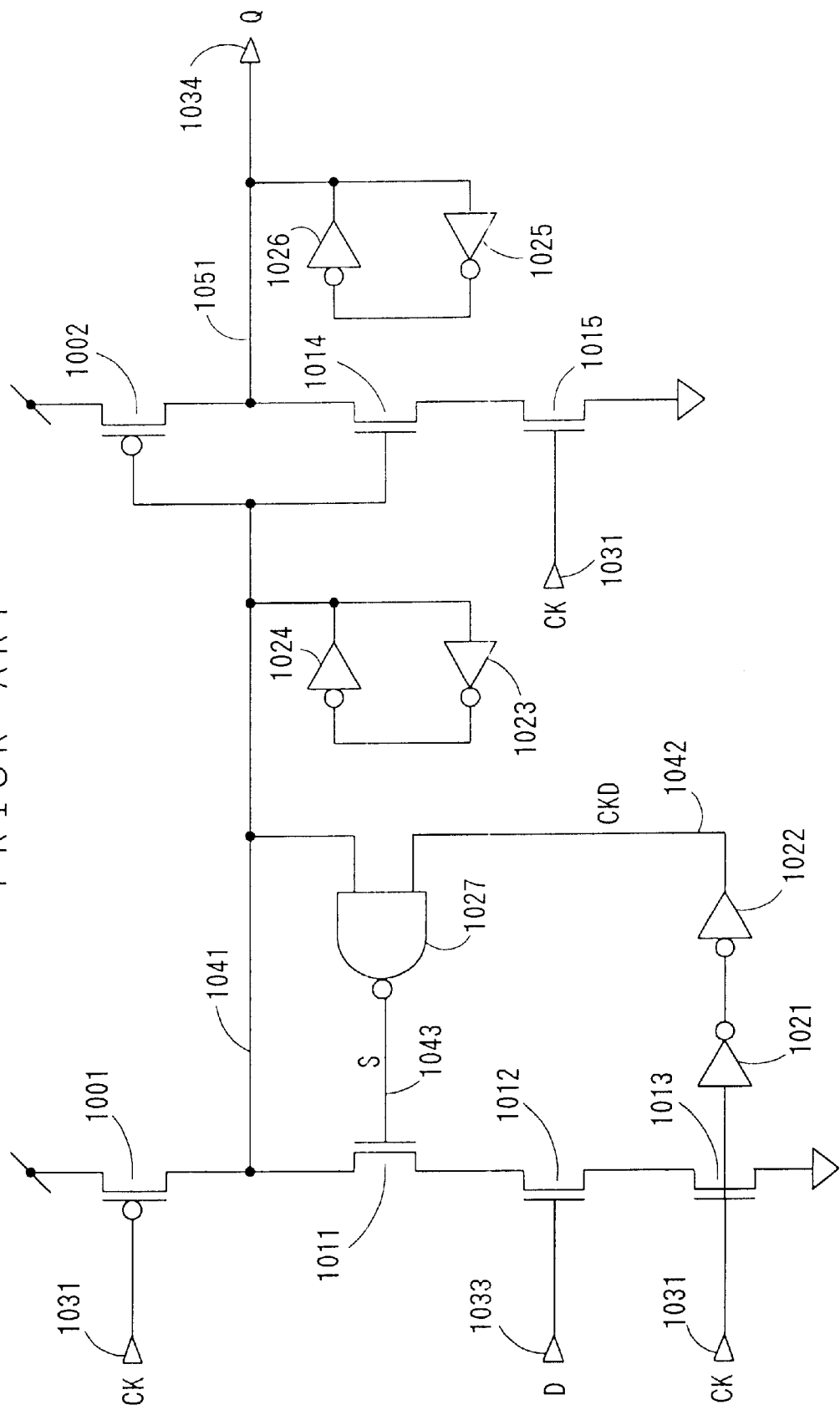
FIG. 7 is a circuit diagram showing the configuration of a conventional data backup memory.

FIG. 6 is a circuit diagram showing the configuration of the data backup memory of the third embodiment. In FIG. 6, the pulse signal generating circuit 310 is identical to that described in the second embodiment. The configuration and operation of the circuit of the pulse signal generating circuit 310 have already been described in the second embodiment, so description thereof is omitted.

Reference numerals 801 to 832 denote the same data backup memories as that (100) described in the first embodiment. Thus, the configuration and operation of the circuits of the data backup memories 801 to 832 have already been described in the first embodiment, so description thereof is omitted.

The clock signal input terminal (CKIN) 311 of the pulse signal generating circuit 310 is connected to a clock signal input terminal (CK) 600, and the pulse signal output terminal (PULSEOUT) 312 is connected to the pulse signal terminals (CK1) 131 of the data backup memories 801 to 832.

The input data terminals (D) of the data backup memories 801 to 832 are connected to input data terminals (D1) 602 to (D32) 632, respectively, and the data output terminal (Q) 134 is connected to data output terminals (Q1) 701 to (Q32) 732.

An operation of the data backup memory device 300 of the third embodiment configured as described above will be described.

In the third embodiment, when a clock signal is input to the clock signal input terminal (CK) 600, it is input to the clock signal input terminal (CKIN) 311 of the pulse signal generating circuit 310, the operation of which has been described in the second embodiment. A pulsed signal from the pulse signal output terminal (PULSEOUT) 312 is input to the pulse signal terminals (CK1) 131 of the data backup memories 801 to 832, the operation of which has been described in the first embodiment. The values for the input data terminals (D1) 601 to (D32) 632 can be written to the data backup memory device 300 both at a rising and a falling edges of the clock signal input to the clock signal input terminal (CK) 600, whereas the data retaining operation can be performed during the other periods.

As described above, due to the constitutional characteristic (the N channel transistors 111 of the data backup memories 801 to 832 to which the input data terminals (D1) 601 to (D32) 632 are connected and the N channel transistors 112 of data backup memories 501 to 532 to which the pulse signal terminals (CK1) 131 are connected are connected in series) of the data backup memory of the third embodiment, the setup time for this memory is ideally zero. Further, the worst value of the delay time required before output signals from the input data terminals (D1) 601 to (D32) 632 are written to the second precharge nodes 142 of the data backup memories 801 to 832 is the sum of the time required by the two N channel transistors 111 and 112 connected together in series to discharge the first precharge node 141 and the delay time required by the P channel transistor 102 to precharge the second precharge nodes 142. Consequently, the worst value of the delay time can be designed to be smaller.

Furthermore, the worst value of this delay time can be designed to be smaller than that of the delay time in the data backup memory shown in the conventional example. Moreover, with an increased number of bits, the scale of the circuit corresponding to the all the bits can be reduced.

Further, the data can be written to the memory both at the rising and falling edges of the clock signal, so that when the data backup memories of the third embodiment is used to design an LSI, they can operate at a frequency double that of the clock provided.

In the third embodiment, the 32 data backup memories, for which the configuration and operation of the circuits have been described in the first embodiment, are used so that 32 bits of data can be written thereto. The configuration, however, is possible with a different number of data backup memories, and similar effects are obtained.

I claim:

1. A data backup memory device using as input a timing control signal having a period indicating a first phase and a period indicating a second phase as well as a data signal that can assume a first state and a second state, to process said data signal synchronously with said timing control signal and temporarily store the state of said data signal, said data backup memory device comprising:

a pulse signal generating circuit and at least one data backup memory, said data backup memory comprising:
a first precharge node, a second precharge node, a first precharge circuit, a second precharge circuit, a first discharge circuit, and a second discharge circuit, wherein
said pulse signal generating circuit for outputting a pulse signal having a first pulse potential period corresponding to a fixed period from a point of time of a change in said timing control signal from a first phase period to a second phase period and from a point of time of a change therein from said second phase period to said first phase period, and a second pulse potential period that is different from said first pulse potential period,
said first precharge circuit for increasing a potential at said first precharge node up to and above a first boundary value during said second pulse potential period of said pulse signal,
said first discharge circuit for reducing the potential at said first precharge node below the first boundary value while said input data signal is in the second state during the first pulse potential period of said pulse signal,
said second precharge circuit for increasing a potential at said second precharge node up to or above a second boundary value while the potential at said first precharge node is below said first boundary value, and
said second discharge circuit for reducing the potential at said second precharge node below said second boundary value while the potential at said first precharge node is equal to or above said first boundary value during the first pulse potential period of said pulse signal, the potential at said second precharge node being an output data signal.

2. The data backup memory device according to claim 1, wherein the pulse generating circuit comprises an input terminal for receiving input of the timing control signal as an input signal, an output terminal for outputting a generated a pulse signal, a two-input exclusive OR circuit, and a pulse width setting circuit for arbitrarily setting a pulse width for said input signal by delaying said input signal for a fixed period of time, said input terminal is connected to a first input of said two-input exclusive OR circuit and to an input of said pulse width setting circuit, an output of said pulse width setting circuit is connected a second input of said two-input exclusive OR circuit, and an output of said two-input exclusive OR circuit is connected to said output terminal.

3. The data backup memory device according to claim 1, further comprising a first data retaining circuit for retaining the potential at the first precharge node while at least both the first precharge circuit and the first discharge circuit are inactive, and a second data retaining circuit for retaining the potential at the second precharge node while at least both the second precharge circuit and the second discharge circuit are inactive.

4. The data backup memory device according to claim 1, wherein the timing control signal has a logic level zero during the first phase period and a logic level one during the second phase period, the input data signal has the logic level zero in the first state and the logic level one in the second state, the first pulse potential period is at the logic level one whereas the second potential period is at the logic level zero, a potential equal to or more than the first boundary value is at the logic level one and a potential less than said first boundary value is at the logic level zero, and a potential equal to or more than the second boundary value is at the logic level one and a potential lower than the second boundary value is at the logic level zero.

* * * * *